(12) United States Patent
Sugita

(10) Patent No.: US 10,044,363 B2
(45) Date of Patent: Aug. 7, 2018

(54) SEMICONDUCTOR DEVICE AND AD CONVERSION DEVICE

(71) Applicant: RENESAS ELECTRONICS CORPORATION, Tokyo (JP)

(72) Inventor: Norio Sugita, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/697,216

(22) Filed: Sep. 6, 2017

(65) Prior Publication Data

US 2018/0069565 A1 Mar. 8, 2018

(30) Foreign Application Priority Data

Sep. 7, 2016 (JP) .................. 2016-174385

(51) Int. Cl.
*H03M 1/34* (2006.01)
*H03M 1/18* (2006.01)
*H03M 1/14* (2006.01)
*H03M 1/12* (2006.01)

(52) U.S. Cl.
CPC ............ *H03M 1/34* (2013.01); *H03M 1/123* (2013.01); *H03M 1/142* (2013.01); *H03M 1/148* (2013.01); *H03M 1/182* (2013.01)

(58) Field of Classification Search
CPC ........ H03M 1/34; H03M 1/148; H03M 1/142; H03M 1/123; H03M 1/182; H03M 1/14; H03M 1/12; H03M 1/18
USPC .................................. 341/155, 158
See application file for complete search history.

(56) References Cited

U.S. PATENT DOCUMENTS 9,417,644 B2 * 8/2016 Kim ................ G05F 1/468
2016/0269040 A1 * 9/2016 Lee ................ H03M 1/002

FOREIGN PATENT DOCUMENTS

JP 05-282053 * 10/1993
JP 2015-133631 A 7/2015

* cited by examiner

*Primary Examiner* — Jean B Jeanglaude
(74) *Attorney, Agent, or Firm* — McDermott Will & Emery LLP

(57) ABSTRACT

A semiconductor device includes an AD conversion unit that performs AD conversion on an input signal based on a reference voltage to be supplied, a reference voltage detection unit that detects the reference voltage supplied to the AD conversion unit, and a control unit that corrects a result of the AD conversion by the AD conversion unit in accordance with the reference voltage detected by the reference voltage detection unit. Thereby, AD conversion can be performed accurately even when a reference voltage varies.

11 Claims, 7 Drawing Sheets

SEMICONDUCTOR DEVICE AND AD CONVERSION DEVICE

CROSS-REFERENCE TO RELATED APPLICATIONS

The disclosure of Japanese Patent Application No. 2016-174385 filed on Sep. 7, 2016 including the specification, drawings and abstract is incorporated herein by reference in its entirety.

BACKGROUND

The present invention relates to a semiconductor device and an AD conversion device, and, for example, to a semiconductor device and an AD conversion device that convert an analog signal into a digital signal.

AD converters (ADCs) for converting an analog signal into a digital signal are widely used in various apparatuses and systems. For example, in a drive control device of a brushless DC motor, three-phase signals for the motor are converted into digital signals by an AD converter, and based on the digital signals, feedback control is performed such that the motor rotates at a desired speed.

In recent years, an AD converter with high AD conversion accuracy is desired in order to deal with various applications. As a related technique, for example, Japanese Unexamined Patent Application Publication No. 2015-133631 is known.

SUMMARY

Generally, an AD converter converts an analog signal into a digital signal based on a reference voltage. The present inventors have found that this reference voltage may affect the AD conversion accuracy of an AD converter. Therefore, an object of one embodiment is to further improve AD conversion accuracy.

Other problems and new characteristics will become clear from the description and accompanying drawings of the present specification.

According to one embodiment, a semiconductor device includes an AD conversion unit, a reference voltage detection unit, and a control unit. The AD conversion unit performs AD conversion on an input signal based on a reference voltage to be supplied. The reference voltage detection unit detects the reference voltage of the AD conversion unit, and the control unit corrects a result of the AD conversion by the AD conversion unit in accordance with the detected reference voltage.

According to the one embodiment, AD conversion accuracy can be further improved.

DETAILED DESCRIPTION

Figure 1:
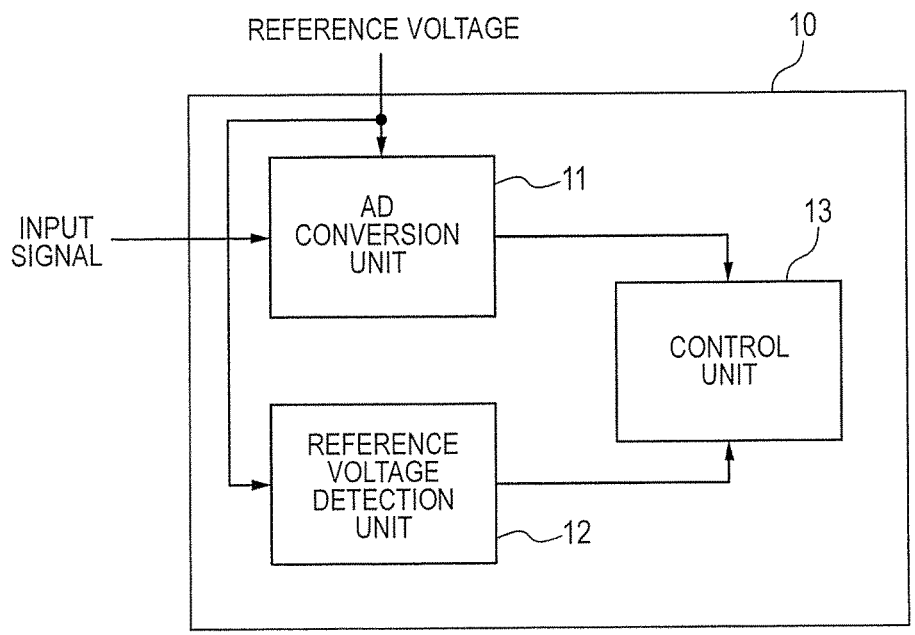
FIG. 1 is a configuration diagram illustrating a schematic configuration example of a semiconductor device according to an embodiment.

For clarity of description, abbreviation and simplification are appropriately made in the following description and drawings. Each element illustrated in the drawings as a functional block performing various processing can be constituted by a CPU, a memory, and other circuits in terms of hardware, and can be achieved by a program loaded in the memory in terms of software. Therefore, it is understood by those skilled in the art that these functional blocks can be achieved in various forms by hardware only, software only, or a combination thereof, and the blocks should not be limited to any one of them. In each drawing, the same reference numerals are assigned to the same elements, and duplicative description is omitted as necessary.

Outlines of Embodiment

Outline of the characteristics of the later-described embodiment will be first described. FIG. 1 illustrates a schematic configuration example of a semiconductor device according to an embodiment, and FIG. 2 illustrates a schematic configuration example of an AD conversion device including the semiconductor device according to the embodiment.

In the example of FIG. 1, a semiconductor device 10 includes an AD conversion unit 11, a reference voltage detection unit 12, and a control unit 13. The AD conversion unit 11 performs AD conversion on an input signal based on a reference voltage to be supplied. The reference voltage detection unit 12 detects the reference voltage supplied to the AD conversion unit 11. The control unit 13 corrects a result of the AD conversion by the AD conversion unit 11 in accordance with the reference voltage detected by the reference voltage detection unit 12.

Part of the internal configuration of the semiconductor device 10 may be provided outside the semiconductor device 10. For example, in the example of FIG. 2, the reference voltage detection unit 12 is provided outside the semiconductor device. That is, in the example of FIG. 2, an AD conversion device 20 includes the reference voltage detection unit 12 and the semiconductor device 10, and the semiconductor device 10 includes the AD conversion unit 11 and the control unit 13.

Figure 2:
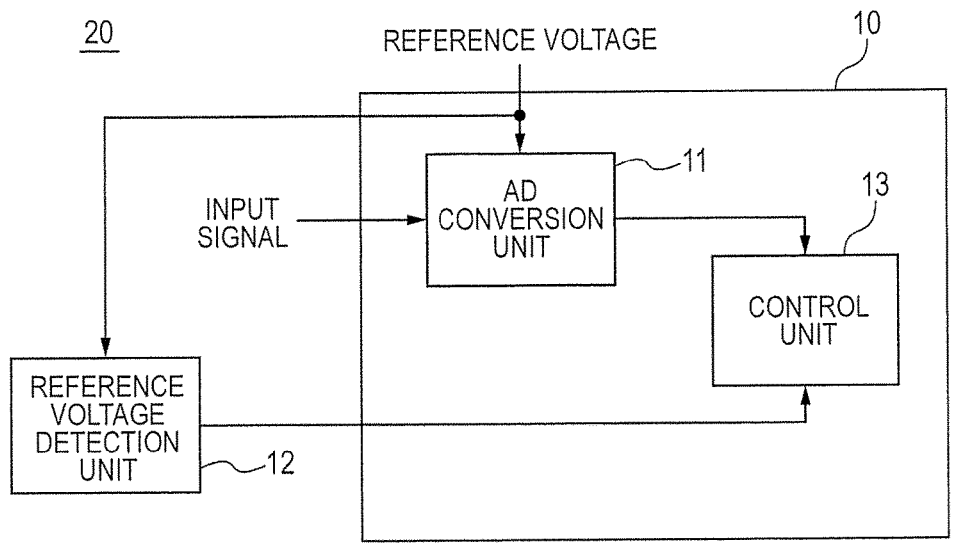
FIG. 2 is a configuration diagram illustrating a schematic configuration example of an AD conversion device according to an embodiment.

In the embodiment, a reference voltage to be used in AD conversion is detected, and a result of the AD conversion is corrected based on the detected reference voltage, as illustrated in FIGS. 1 and 2. With this, an accurate result of AD conversion, corresponding to a reference voltage, can be obtained even when the reference voltage varies, and hence AD conversion accuracy can be improved.

Reference Example

Figure 3:
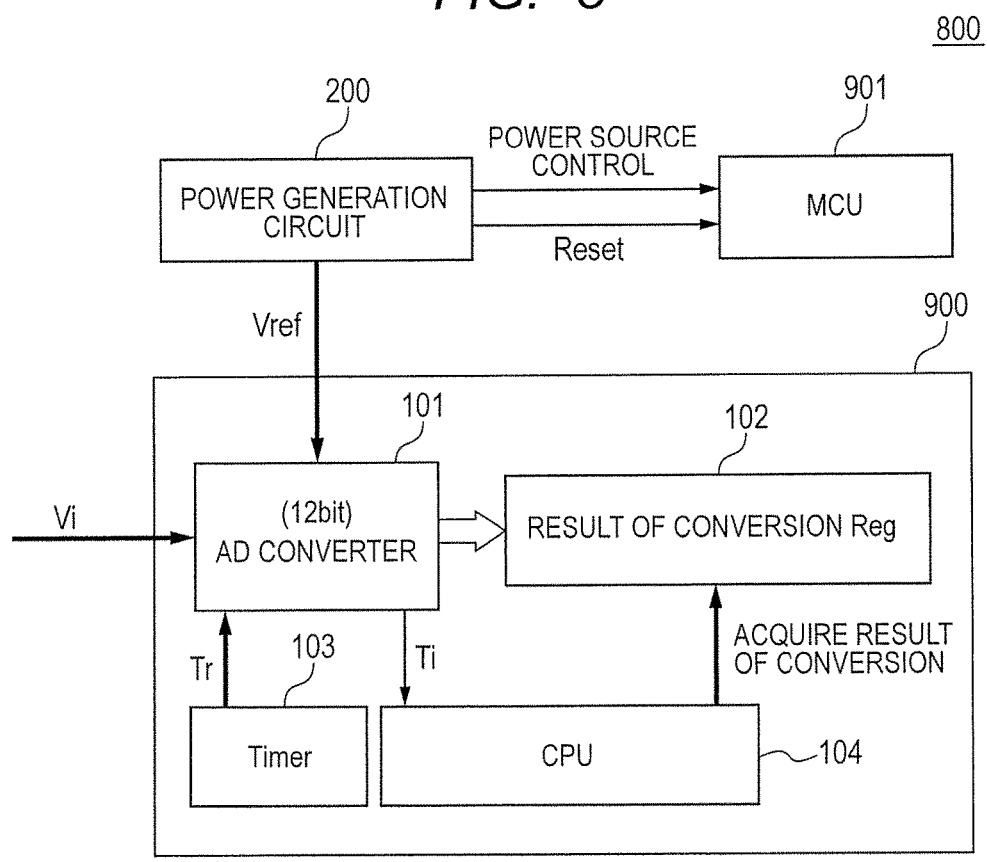
FIG. 3 is a configuration diagram illustrating a configuration example of a basic system of a reference example.

Next, in order to facilitate the understanding of the embodiment, a reference example will be described as a reference for the embodiment. FIG. 3 is a block diagram illustrating a configuration example of a basic system of a reference example.

As illustrated in FIG. 3, a basic system 800 of a reference example includes an MCU (Micro Control Unit) 900 and a power generation circuit 200, and further includes another MCU 901 and the like. The power generation circuit 200 is a circuit for generating power to be supplied to the MCUs 900 and 901, and generates a reference voltage Vref for AD conversion (for an AD converter 101) in the MCU 900.

The MCU (semiconductor device) 900 of the reference example includes a (12 bit) AD converter 101, a conversion result register (Reg) 102, a timer (Timer) 103, and a CPU (Central Processing Unit) 104.

The AD converter (ADC) 101 is a converter for converting an inputted analog input Vi (analog signal) into a digital value (digital signal). The AD converter 101 performs AD conversion based on the reference voltage Vref supplied from the power generation circuit 200, and stores a result of the AD conversion in the conversion result register 102. The conversion result register 102 is a storage unit for storing a result of the AD conversion by the AD converter 101 (digital value of the analog input Vi). The timer 103 counts a predetermined period (sampling period), and generates an AD trigger Tr indicating an AD conversion timing for the AD converter 101.

The AD converter 101 is, for example, a SAR (Successive Approximation Register) type ADC. The SAR type ADC has high resolution, and the power consumption and size thereof can be reduced. Not limited to the SAR type ADC, other ADCs may be used. The AD converter 101 starts, for example, successive approximation processing at the timing of the AD trigger Tr, and performs AD conversion by repeating approximations N times (N bits). Upon completion of the AD conversion processing, the AD converter 101 generates an AD conversion end interrupt Ti.

The AD converter 101 performs AD conversion with a resolution of N bits by setting the reference voltage Vref to a maximum value. When the AD converter 101 is, for example, a 12-bit ADC (ADC with a resolution of 12 bits), the analog input Vi is converted into a digital value between 0 and 4095 (0x000 to 0xFFF) with the reference voltage Vref (e.g., 5 V) set to 4095.

The CPU 104 is an arithmetic processing unit that achieves a function required of the MCU 900. The CPU 104 executes various programs stored in a memory (not illustrated) to acquire a result of the AD conversion by the AD converter 101 and the like, which are stored in the conversion result register 102, and performs arithmetic processing.

Figure 4:
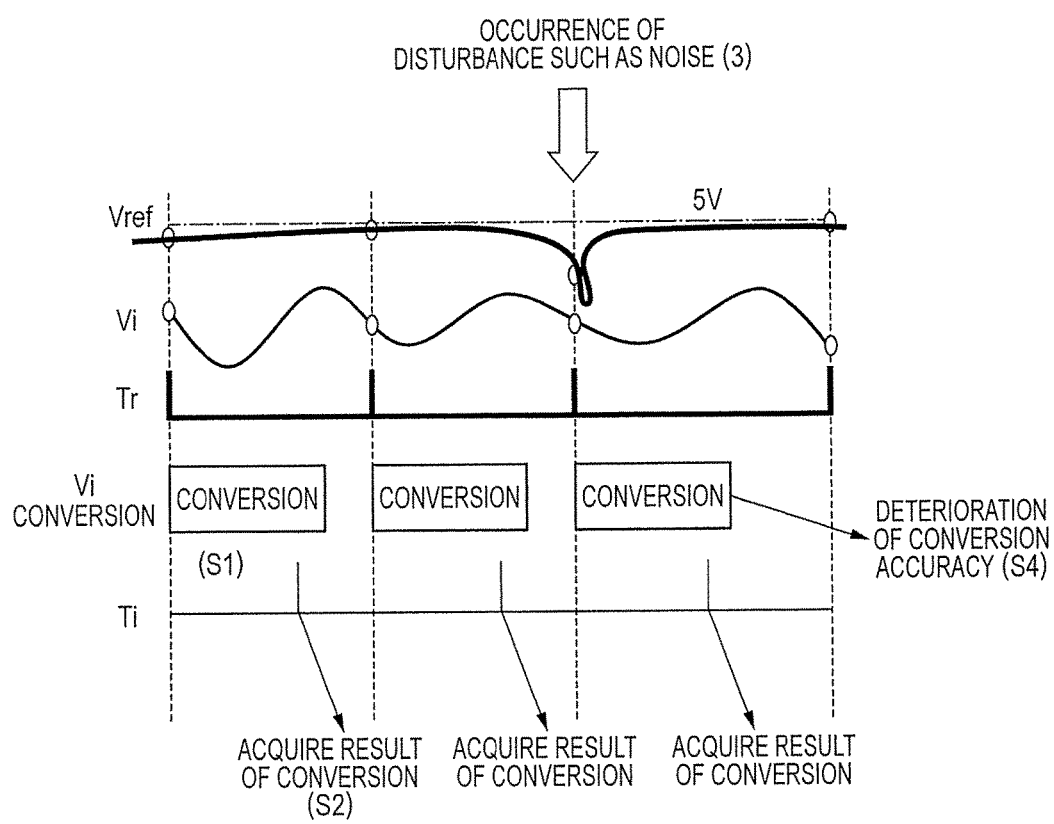
FIG. 4 is a timing chart illustrating an operation example of the basic system of the reference example.

FIG. 4 is a timing chart illustrating AD conversion operations in the MCU 900 of the reference example. As illustrated in FIG. 4, a reference voltage Vref of 5 V is supplied to the AD converter 101, and the analog input Vi is input thereto.

The AD converter 101 performs AD conversion on the analog input Vi at the timing of the AD trigger Tr from the timer 103, and stores a result of the AD conversion in the conversion result register 102 (S1). After the completion of the AD conversion, the AD converter 101 subsequently sends the AD conversion end interrupt Ti to the CPU 104, and the CPU 104 reads out the conversion result register 102 to acquire the result of the AD conversion (S2).

Herein, because the AD converter 101 performs AD conversion by setting the reference voltage Vref to the upper limit value of the digital value, a constant voltage such as 5 V is normally supplied as the reference voltage Vref from the power generation circuit 200. However, for example, when the another MCU 901 is reset, disturbance may be added to the reference voltage Vref depending on the performance (design) of the power generation circuit 200, whereby there is the fear that the reference voltage Vref may instantaneously decrease (S3).

That is, in the reference example, when disturbance such as noise occurs and the reference voltage Vref decreases (or increases), and when the timing at which the reference voltage Vref varies coincides with the timing of the AD trigger Tr, as illustrate in FIG. 4, a digital value having an upper limit value of an unintended reference voltage Vref is stored in the conversion result register 102 at the time (S4). When the AD converter 101 is a 12-bit ADC, the AD conversion is performed with the varied reference voltage Vref, not 5 V, set to 4095. Therefore, there is the problem in the reference example that AD conversion accuracy is decreased as a result.

Therefore, it is made possible in the embodiment to suppress a reduction in the AD conversion accuracy and to perform AD conversion with high accuracy, even when the reference voltage Vref to be supplied to the AD converter varies.

In the above Japanese Unexamined Patent Application Publication No. 2015-133631, it is described that a desired resolution is obtained by actively changing the reference voltage of an AD converter, but a mechanism for detecting a variation in the reference voltage is not provided; and hence there is the problem that when the reference voltage varies, an error of a result of AD conversion becomes large.

First Embodiment

Hereinafter, First Embodiment will be described with reference to the accompanying drawings.

In such a configuration of the above reference example, the power generation circuit 200 inputs a constant value to the MCU 900 as the reference voltage Vref, but the MCU 900 cannot detect the reference voltage Vref. Therefore, a system for improving AD conversion accuracy and detecting an abnormality is achieved in the present embodiment, in which a result of AD conversion stored in the conversion result register 102 is corrected by adding "a mechanism by which it is known at which reference voltage the result of AD conversion is obtained" and by calculation using the reference voltage Vref and a value of the conversion result register 102.

Figure 5:
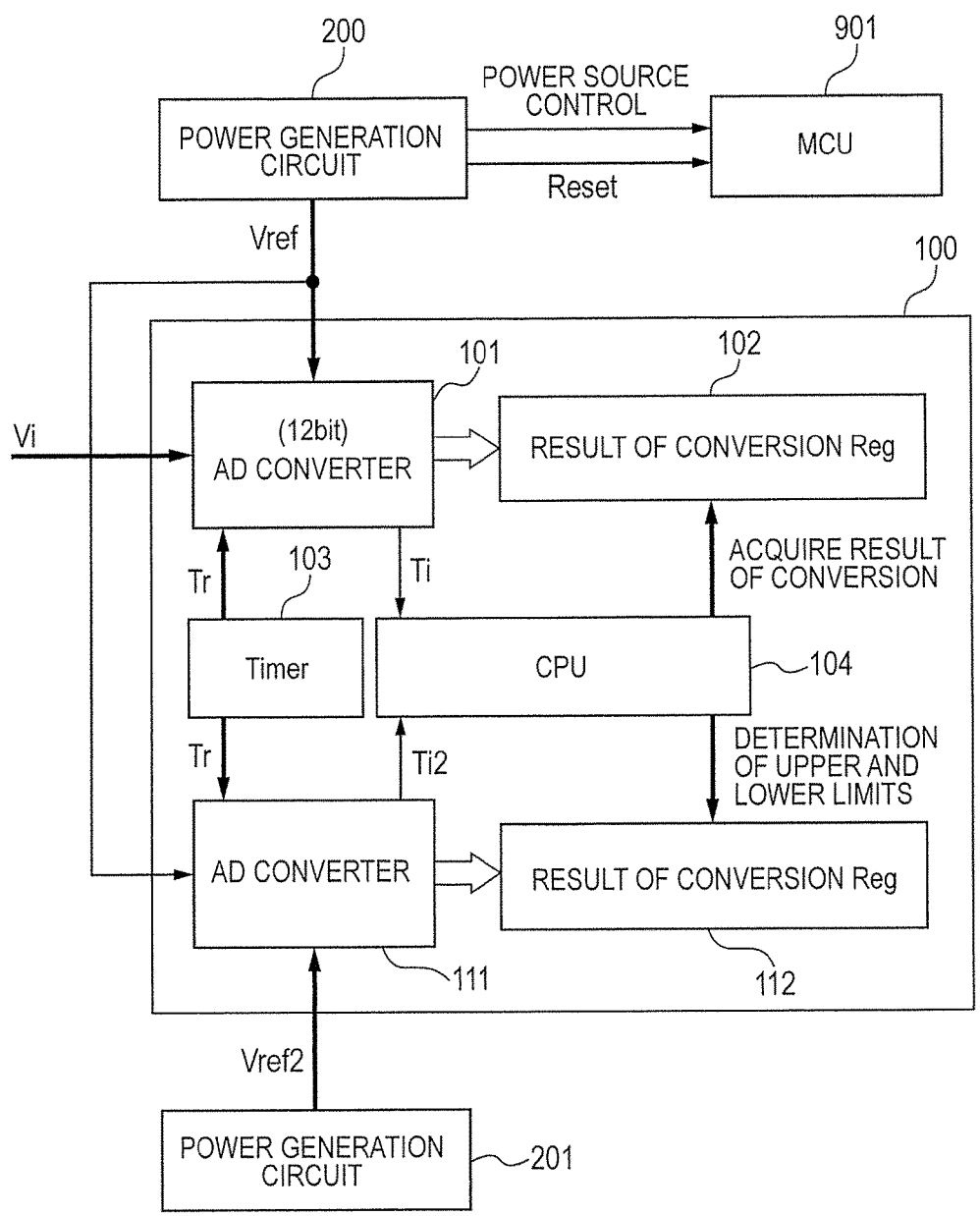
FIG. 5 is a configuration diagram illustrating a configuration example of a basic system according to First Embodiment.

FIG. 5 is a block diagram illustrating a configuration example of a basic system according to the present embodiment. As illustrated in FIG. 5, a basic system 300 according to the embodiment includes a power generation circuit (first power generation circuit) 200 and an MCU 901, which are similar to those in the reference example, and further includes an MCU 100 according to the embodiment and a power generation circuit (second power generation circuit) 201. The power generation circuit 201 is a circuit that generates power to be supplied to the MCU 100, separately from the power generation circuit 200, and generates a reference voltage Vref2 for AD conversion (for an AD converter 111) in the MCU 100.

The MCU (semiconductor device) 100 according to the present embodiment includes a (12-bit) AD converter (first AD converter) 101, a conversion result register (first conversion result register) 102, a timer 103, and a CPU 104, similarly to the reference example, and further includes the AD converter (second AD converter) 111 and a conversion result register (second AD converter) 112.

The AD converter (second AD converter) 111 is a converter that converts the reference voltage Vref to be supplied to the AD converter 101 from an analog input to a digital value (digital signal). It can also be said that the AD converter 111 is a detection unit for detecting the voltage value of the reference voltage Vref. The AD converter 111 performs AD conversion based on the reference voltage Vref2 supplied from the power generation circuit 201, and stores a result of the AD conversion in a conversion result register 112. A variation in the reference voltage Vref can be detected by performing AD conversion based on another reference voltage Vref2 (second reference voltage), not based on the reference voltage Vref (first reference voltage). The conversion result register 112 is a storage unit for storing a result of the AD conversion by the AD converter 111 (digital value of the reference voltage Vref).

The AD converter 111 is, for example, a SAR type ADC like the ADC 101, but other ADCs may be used. Because it is sufficient only to detect a variation in the reference voltage Vref, a converter with a lower resolution than the AD converter 101 may be used. The AD converter 111 performs AD conversion at the timing of the same AD trigger Tr as the AD converter 101, and upon completion of the AD conversion processing, generates an AD conversion end interrupt Ti2. The timer 103 generates the AD trigger Tr for the AD converters 101 and 111 such that the AD converters 101 and 111 perform AD conversion at the timing of the same AD trigger Tr, thereby allowing the result of the AD conversion to be accurately corrected in accordance with a variation in the reference voltage Vref. The voltage value of the reference voltage Vref can be reliably detected by the AD converter 111, but the reference voltage may be detected by other detection circuits such as a sensor, not limited to an AD converter.

In the present embodiment, the CPU 104 corrects, from the values of the conversion result registers 102 and 112, the result of the AD conversion on the analog input Vi by obtaining the result of the AD conversion on the reference voltage Vref itself from the conversion result register 112. The CPU 104 may correct the result of the AD conversion when the reference voltage Vref varies from a predetermined value. For example, the result of the AD conversion is corrected such that the detected actual reference voltage Vref becomes a maximum value of the result of the AD conversion. Thereby, the result of the AD conversion can be corrected to an accurate value. Further, when the value of the conversion result register 112 does not fall within the range between the set upper limit value and lower limit value, a system abnormality can be detected.

Figure 6:
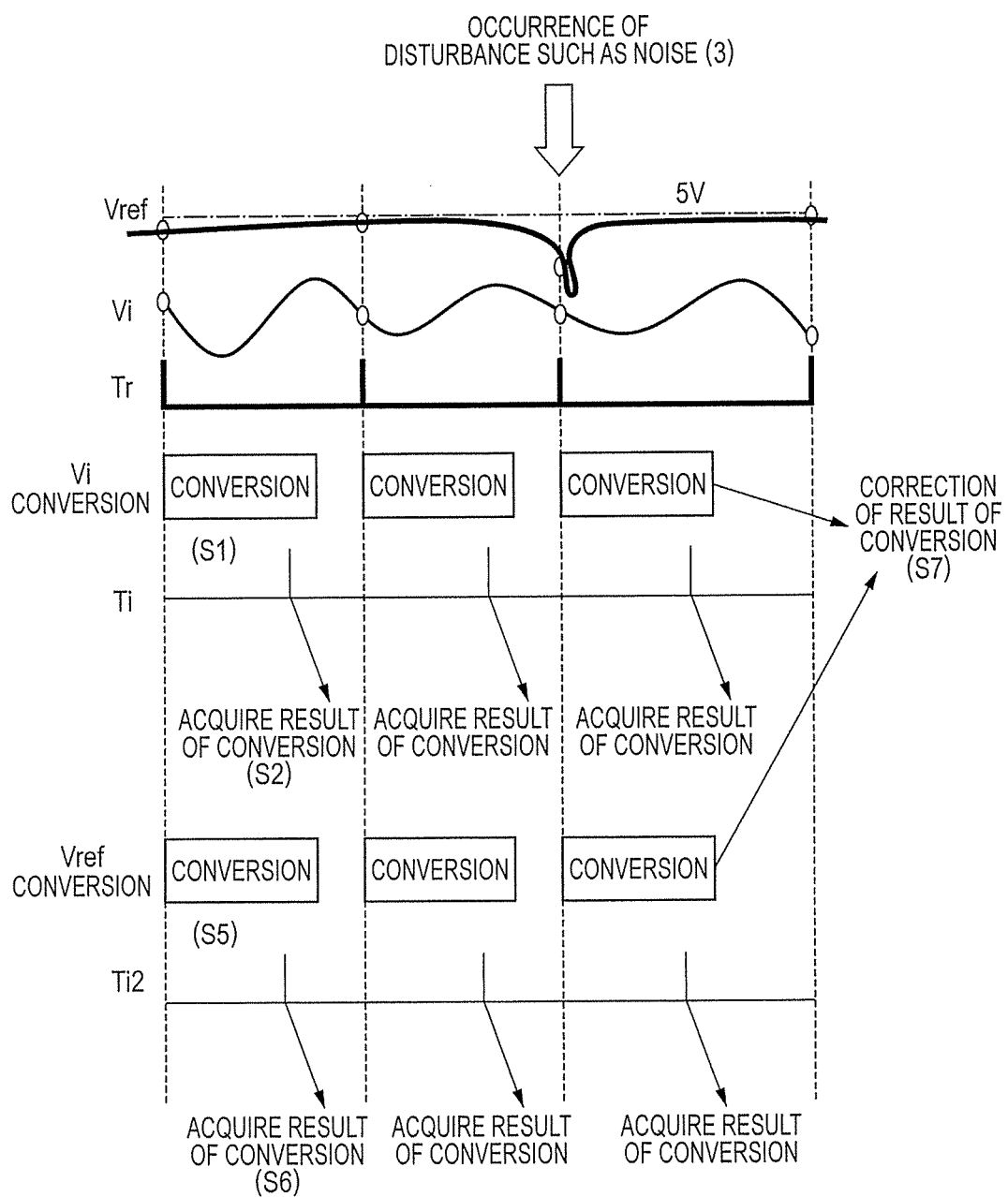
FIG. 6 is a timing chart illustrating an operation example of the basic system according to First Embodiment.

FIG. 6 is a timing chart illustrating AD conversion operations in the MCU 100 according to the present embodiment. As illustrated in FIG. 6, a reference voltage Vref of 5 V is supplied to the AD converter 101 and the analog input Vi is input thereto, similarly to the reference example. In addition, a constant reference voltage Vref2 of, for example, 5 V is supplied to the AD converter 111 (not illustrated), and the reference voltage Vref of the AD converter 101 is input as an analog input.

The AD converter 101 performs AD conversion on the analog input Vi at the timing of the AD trigger Tr from the timer 103, and stores a result of the AD conversion in the conversion result register 102 (S1). The AD converter 111 performs AD conversion on the reference voltage Vref at the timing of the same AD trigger Tr, and stores a result of the AD conversion in the conversion result register 112 (S5).

After the completion of the AD conversion, the AD converter 101 subsequently sends the AD conversion end interruption Ti to the CPU 104, and the CPU 104 reads out the conversion result register 102 to acquire the result of the AD conversion on the analog input (S2). At this time, the CPU 104 acquires the result of the AD conversion on the reference voltage Vref from the conversion result register 112, and corrects the result of the AD conversion on the analog input based on the result of the AD conversion on the reference voltage Vref (S7). For example, when the result of the AD conversion on the reference voltage Vref is 4.8 V, the result (0 to 4095) of the AD conversion on the analog input is converted into a scale of 4.8 V (the maximum value is set to 4.8 V). As a result, when a disturbance or the like occurs in the reference voltage Vref (S3), the error can be corrected.

In addition, the AD converter 111 sends the AD conversion end interrupt Ti2 to the CPU 104 after the completion of the AD conversion, and the CPU 104 reads out the conversion result register 112 to acquire the result of the AD conversion on the reference voltage Vref (S6). At this time, the CPU 104 determines the result of the AD conversion on the reference voltage Vref, and determines whether the reference voltage Vref is within a predetermined range. When the result of the AD conversion on the reference voltage Vref is, for example, 4.5 V to 5.5 V, it is determined to be normal, and when it is 4.5 V or less or 5.5 V or more, it is determined to be abnormal. In the case of abnormality, the abnormality may be set in a register or the like in the MCU, or may be notified to the outside of the MCU. As a result, when a disturbance or the like occurs in the reference voltage Vref (S3), the abnormality can be notified to the outside.

As described above, the present embodiment is characterized by including a circuit in which AD conversion is performed on a reference voltage of an AD converter performing AD conversion by using another AD converter, whereby a mechanism, by which it is known at which reference voltage a result of the AD conversion is obtained, is achieved. According to the embodiment, even when a reference voltage varies due to a disturbance or system abnormality, a result of AD conversion and the value of the reference voltage at that time are checked such that the result of the AD conversion is corrected based on the value of the reference voltage, thereby allowing AD conversion accuracy to be improved. Further, when the value of the reference voltage is beyond the set upper limit value or lower limit value, a system abnormality can be determined if necessary and a failure can also be detected.

Second Embodiment

Hereinafter, Second Embodiment will be described with reference to the accompanying drawings. In the present embodiment, one example of a power generation circuit that generates power to be supplied to the MCU 100 according to First Embodiment will be described.

Figure 7:
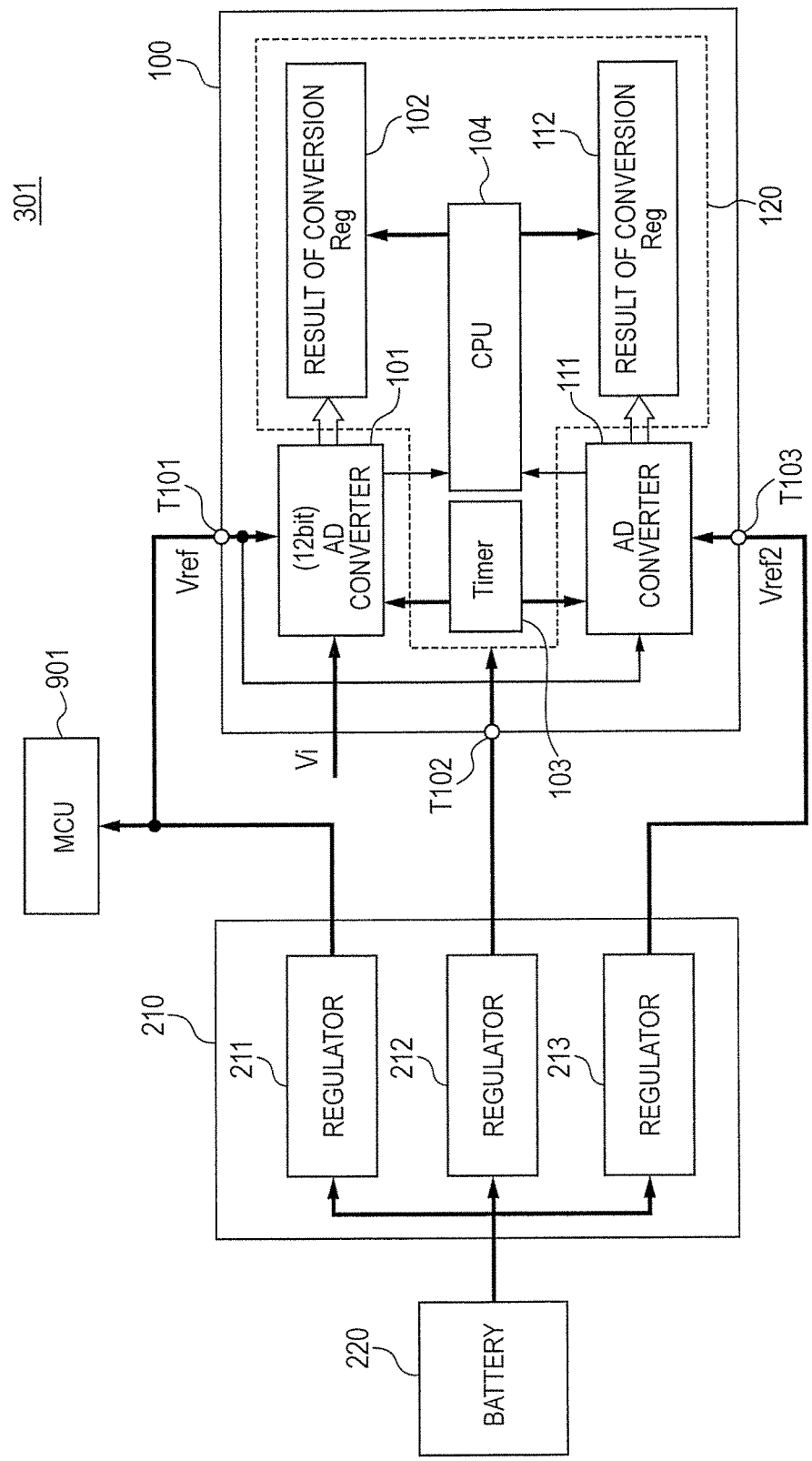
FIG. 7 is a configuration diagram illustrating a configuration example of an application system according to Second Embodiment.

FIG. 7 illustrates a configuration example of an application system according to the present embodiment. As illustrated in FIG. 7, an application system 301 according to the embodiment includes MCUs 100 and 901 similar to those in First Embodiment, and further includes a power generation circuit 210 and a battery 220 according to the present embodiment.

The application system 301 is, for example, an in-vehicle system, and the battery 220 is a general 12 V power supply device. The power generation circuit 210 generates a plurality of power required of the MCUs 100 and 901. In this example, the power generation circuit 210 includes regulators 211 to 213. Each of the regulators 211 to 213 is an independent power generation circuit, and includes, for example, a DC-DC converter or an LDO (Low Drop Out) type regulator.

The regulator 211 generates, for example, a voltage of 5 V from the voltage of 12 V supplied from the battery 220, and supplies the generated voltage of 5 V both to an AD converter 101 in the MCU 100 and the MCU 901. The MCU 100 includes a power supply terminal T101 for the AD converter 101 such that a reference voltage Vref is supplied to the AD converter 101 via the power supply terminal T101. When the same power is supplied to the AD converter 101 and the MCU 901, there is the fear as described above that the reference voltage Vref may vary due to resetting of the MCU 901 or the like.

The regulator 212 generates, for example, a voltage of 3.3 V from the voltage of 12 V supplied from the battery 220, and supplies the generated voltage of 3.3 V to a system area 120 in the MCU 100. The system area 120 includes, a timer 103, a CPU 104, and conversion result registers 102 and 112. The MCU 100 includes a power supply terminal T102 for the system area such that power is supplied to each circuit in the system area 120 via the power supply terminal T102. The power for the timer 103, the CPU 104, and the conversion result registers 102 and 112 may be generated and supplied by regulators different from each other.

The regulator 213 generates, for example, a voltage of 5 V from the voltage of 12 V supplied from the battery 220, and supplies the generated voltage of 5 V to an AD converter 111 in the MCU 100. The MCU 100 includes a power supply terminal T103 for the AD converter 111 such that a reference voltage Vref2 is supplied to the AD converter 111 via the power supply terminal T103. As described above, the AD converter 111 detects the reference voltage Vref of the AD converter 101, and hence it is preferable that the power supplied by the regulator 213 varies as little as possible.

In the present embodiment, power is supplied to a plurality of AD converters from regulators in a power generation circuit, as described above. The regulators (power generation circuits) can supply stable power even when the power is generated from the same battery. Therefore, AD conversion accuracy can be improved.

Third Embodiment

Hereinafter, Third Embodiment will be described with reference to the accompanying drawings. In the present embodiment, an example will be described in which the configuration of First Embodiment is applied to a motor control system.

Figure 8:
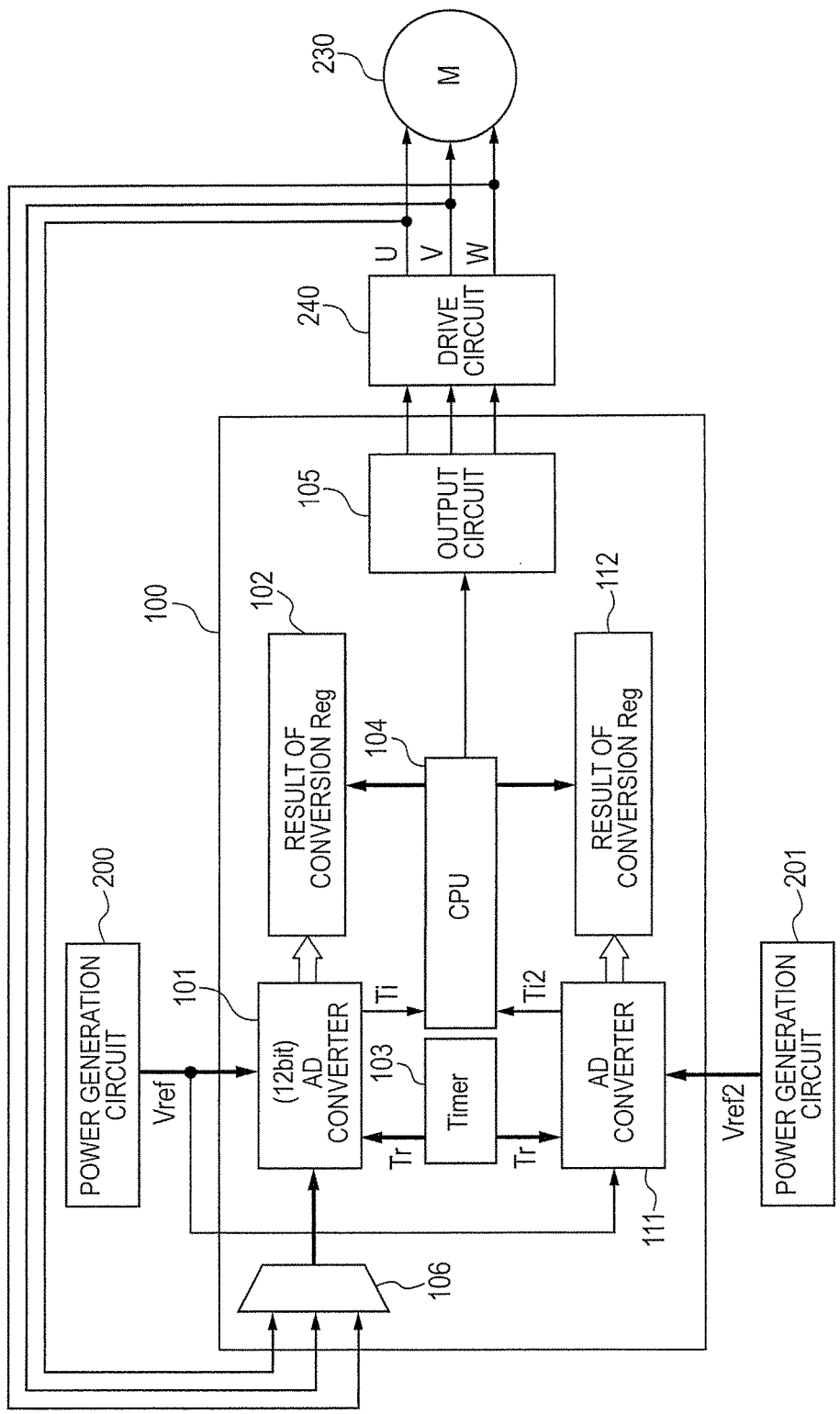
FIG. 8 is a configuration diagram illustrating a configuration example of an application system according to Third Embodiment.

FIG. 8 illustrates a configuration example of an application system according to the present embodiment. As illustrated in FIG. 8, an application system 302 according to the embodiment includes an MCU 100 according to the embodiment, a drive circuit 240, and a motor 230.

The motor 230 is, for example, a brushless DC motor, and includes three-phase coils of U phase, V phase, and W phase. The drive circuit 240 is, for example, an inverter, and supplies current to the three coils of the motor 230 in accordance with a PWM (Pulse Width Modulation) signal from the MCU 100.

The MCU 100 according to the present embodiment includes an output circuit 105 and a multiplexer 106 in addition to the configuration of First Embodiment. The output circuit 105 generates a PWM signal for driving the motor 230 in accordance with a command from the CPU 104, and outputs the generated PWM signal to the drive circuit. The multiplexer 106 switches connections between the three-phase currents (drive signals) output from the drive circuit 240 and the ADC 101.

The ADC 101 samples the three-phase currents generated by the drive circuit 240. A timing hold (sample hold) circuit (not illustrated) is provided at the input terminal of the multiplexer 106. Three-phase currents at the same timing are held by the timing hold, and the held currents are sequentially sampled by switching the input to the ADC with the multiplexer. As a result, three-phase currents at the same timing can be sampled. The CPU 104 acquires the sampled current value to estimate the rotational angle or the rotational speed of the motor. The CPU 104 gives the output circuit 105 a command to drive the motor based on an error between the estimated rotational angle or rotational speed and a predetermined value.

In the present embodiment, the configuration of First Embodiment is applied to a motor control system, as described above. Even in this case, the performance of the entire system can be improved by a highly accurate AD converter, and in particular signals at the same timing can be stably sampled.

The above program can be stored by using various types of non-transitory computer readable media and supplied to a computer. The non-transitory computer readable media include various types of tangible storage media. Examples of the non-transitory computer readable media include magnetic recording media (e.g., flexible disk, magnetic tape, and hard disk drive), magneto-optical recording media (e.g., magneto-optical disk), CD-ROM (Read Only Memory), CD-R, CD-R/W, and semiconductor memories (e.g., mask ROM, PROM (Programmable ROM), EPROM (Erasable PROM), flash ROM, and RAM (Random Access Memory)). Alternatively, the program may be provided to a computer by various types of transitory computer readable media. Examples of the transitory computer readable media include electrical signals, optical signals, and electromagnetic waves. The transitory computer readable media can supply the program to a computer via a wired communication path such as a wire and an optical fiber, or a wireless communication path.

The invention made by the present inventors has been specifically described based on preferred embodiments; however, it is needless to say that the invention should not be limited to the above-described embodiments and various modifications may be made to the invention within a range not departing from the gist of the invention.

What is claimed is:

1. A semiconductor device comprising:
   a first AD conversion unit configured to:
      receive an input signal and a first reference voltage, and perform first AD conversion on the input signal based on the first reference voltage;
   a second AD conversion unit different from the first AD conversion unit and configured to:
      receive the first reference voltage and a second reference voltage different from the first reference voltage,
      perform second AD conversion on the first reference voltage based on the second reference voltage, and
      output a result of the second AD conversion; and
   a control unit configured to correct a result of the first AD conversion in accordance with the result of the second AD conversion.

2. The semiconductor device according to claim 1, wherein, when a voltage value of the first reference voltage changes from a predetermined value, the control unit corrects the result of the first AD conversion.

3. The semiconductor device according to claim 2,
wherein the control unit corrects the result of the first AD conversion such that the result of the second AD conversion becomes a maximum value of the result of the first AD conversion.

4. The semiconductor device according to claim 2,
wherein, when the voltage value of the first reference voltage is greater than predetermined range, the control unit determines that the first reference voltage is abnormal.

5. The semiconductor device according to claim 1,
wherein the first AD conversion unit performs the first AD conversion at a predetermined timing, and the second AD conversion unit performs the second AD conversion at the predetermined timing.

6. The semiconductor device according to claim 5, comprising:
a timer that specifies the predetermined timing.

7. An AD conversion device comprising:
a semiconductor device including:
  a first AD conversion unit configured to perform first AD conversion on an input signal based on a first reference voltage to be supplied, and a control unit that corrects a result of the first AD conversion; and
  a second AD conversion unit different from the first AD conversion unit and configured to:
    receive the first reference voltage and a second reference voltage different from the first reference voltage,
    perform second AD conversion on the first reference voltage based on the second reference voltage, and output a result of the second AD conversion,
wherein the control unit corrects the result of the first AD conversion in accordance with the result of the second AD conversion.

8. An AD conversion device comprising:
first power generation circuit;
a second power generation circuit different from the first power generation circuit; and
a semiconductor device, wherein the semiconductor device includes:
  a first AD conversion unit that performs a first AD conversion on an input signal based on a first reference voltage supplied from the first power generation circuit,
  a second AD conversion unit that performs a second AD conversion on the first reference voltage based on a second reference voltage supplied from the second power generation circuit, and
  a control unit that corrects a result of the first AD conversion by the first AD conversion unit in accordance with a result of the second AD conversion by the second AD conversion unit.

9. The AD conversion device according to claim 8, comprising:
a timer that generates a conversion trigger for a predetermined timing,
wherein the first and second AD conversion units perform respective AD conversions at a timing of the conversion trigger.

10. The AD conversion device according to claim 8, comprising:
a first register that stores a result of the first AD conversion by the first AD conversion unit,
wherein after the result of the first AD conversion is stored in the first register, the first AD conversion unit notifies the control unit of an end of the first AD conversion, and
wherein, when the notice of the end of the first AD conversion is received, the control unit corrects the result of the first AD conversion.

11. The AD conversion device according to claim 8, comprising:
a second register that stores a result of the second AD conversion by the second AD conversion unit,
wherein after the result of the second AD conversion is stored in the second register, the second AD conversion unit notifies the control unit of an end of the second AD conversion, and
wherein, when the notice of the end of the second AD conversion is received, the control unit determines whether the first reference voltage is abnormal.

* * * * *